(12) United States Patent
Shim et al.

(10) Patent No.: US 12,507,535 B2
(45) Date of Patent: Dec. 23, 2025

(54) ELECTROLUMINESCENCE DISPLAY HAVING REPAIR STRUCTURE

(71) Applicant: LG Display Co., Ltd., Seoul (KR)

(72) Inventors: Sungbin Shim, Paju-si (KR); Sangpil Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 598 days.

(21) Appl. No.: 17/956,654

(22) Filed: Sep. 29, 2022

(65) Prior Publication Data

US 2023/0209914 A1 Jun. 29, 2023

(30) Foreign Application Priority Data

Dec. 27, 2021 (KR) .................. 10-2021-0188531

(51) Int. Cl.
  *H10K 59/123* (2023.01)
  *H10K 50/813* (2023.01)
  *H10K 71/00* (2023.01)

(52) U.S. Cl.
  CPC ......... *H10K 59/123* (2023.02); *H10K 50/813* (2023.02); *H10K 71/861* (2023.02)

(58) Field of Classification Search
  CPC .. H10K 59/123; H10K 50/813; H10K 71/861; H10K 59/121; H10K 59/80515; H10K 59/80517; H10K 59/131; H10K 50/841
  See application file for complete search history.

(56) References Cited

U.S. PATENT DOCUMENTS

| 2007/0120476 A1* | 5/2007 | Park ...................... H10D 86/40 |
| | | 313/506 |
| 2016/0189593 A1 | 6/2016 | Lee et al. |
| 2017/0133620 A1* | 5/2017 | Lee .................. H10K 59/80522 |

(Continued)

FOREIGN PATENT DOCUMENTS

| KR | 10-2015-0112447 A | 10/2015 |
| KR | 10-2015-0113530 A | 10/2015 |
| KR | 10-2018-0073066 A | 7/2018 |

OTHER PUBLICATIONS

European Patent Office, Extended European Search Report, European Patent Application No. 22198748.0, Jun. 6, 2023, five pages.

*Primary Examiner* — Joseph C. Nicely
*Assistant Examiner* — Alvin L Lee
(74) *Attorney, Agent, or Firm* — Fenwick & West LLP

(57) ABSTRACT

An electroluminescence display having a repair structure comprises: a pixel comprising a thin film transistor and a light emitting diode, the thin film transistor including a semiconductor layer, a gate electrode, a source electrode, and a drain electrode, and the light emitting diode including an anode electrode that is connected to the thin film transistor; a repair element having a welding part that is configured to be connected to the thin film transistor; a planarization layer on the repair element and including a depression that overlaps the welding part of the repair element; and an organic material in the depression, wherein the anode electrode includes a first anode electrode layer and a second anode electrode layer, the first anode electrode layer including a portion that is disposed in the depression, and the second anode electrode layer being on the first anode electrode layer and the organic material.

20 Claims, 8 Drawing Sheets

(56) References Cited

U.S. PATENT DOCUMENTS

2017/0155078 A1* 6/2017 Lee .................. H10K 71/60
2020/0013992 A1   1/2020 Cheng
2021/0098551 A1   4/2021 Lee et al.

* cited by examiner

ELECTROLUMINESCENCE DISPLAY HAVING REPAIR STRUCTURE

CROSS-REFERENCE TO RELATED APPLICATION

This application claims the benefit of Republic of Korea Patent Application No. 10-2021-0188531 filed on Dec. 27, 2021, which is hereby incorporated by reference in its entirety.

BACKGROUND

Field of Technology

The present disclosure relates to an electroluminescence display having a repair structure. In particular, the present disclosure relates to an electroluminescence display having a repair structure in which a defected pixel is not processed to be a dark (or black) pixel, but is connected (or detoured) with a normal operating neighboring pixel.

Discussion of the Related Art

Recently, various type of display such as the cathode ray tubes (CRTs), the liquid crystal displays (LCDs), the plasma display panels (PDPs) and the electroluminescent displays have been developed. These various types of display are used to display image data of various products such as computer, mobile phones, bank deposit and withdrawal devices (ATMs), and vehicle navigation systems according to their unique characteristics and purposes.

In particular, the electroluminescent display which is a self-luminous display, has an excellent optical performance such as a viewing angle and color realization degree, so that its application field is gradually widening and is receiving attention as an image display device. Due to these advantages, the electroluminescence display is attracting attention as the most suitable display for realizing a 4K ultra-high-resolution display up to an 8K resolution display. As the resolution is increased, the size of the pixel becomes smaller and the size of the emission area occupied in the pixel also becomes smaller. When the size of the pixel of the electroluminescence display becomes small, it is necessary to secure the size of the emission area as much as possible. To do so, a top emission type structure is applied.

In addition, as the resolution increases, the frequency of occurrence of pixel defects increases due to the electrical connectivity between the element in the pixel or the defect of the element itself. When a pixel is defected, a dark spot processing may be considered, or a repair method for connecting to a neighboring normal pixel may be considered. The repair element includes a cutting part for breaking the connection between the light emitting element and the defective driving element, and a welding part for bypassing the defective driving element and connecting to neighboring normal driving element. For the ultra-high-resolution electroluminescence display of top emission type, the emission area may be reduced in order to provide an area for placing the repair element. This is because the laser irradiation area is configured not to overlap the emission area in order not to damage the light emitting element disposed in the emission area during the laser irradiation process for repair.

In other words, when the repair element is disposed as not being overlapped with the emission area, an area for the repair element is required within the pixel area, so the emission area may be reduced within the pixel area. Thus, increasing resolution is limited. Accordingly, for the electroluminescence display having a top emission type and ultra-high-resolution structure, it is required to develop a new repair structure capable of solving the resolution limitation problem caused by the repair element.

Further, in the repair process in which the laser is irradiated and the repair electrode is connected, the organic insulating layer disposed thereon may swell due to the thermal energy of the laser. The swelling of the organic insulating layer may affect the light emitting element, and may cause the deterioration and shortened the lifespan of the element.

SUMMARY

The purpose of the present disclosure, as for solving the problems described above, is to provide an electroluminescence display in which a repair element is overlapped with an emission area to implement the ultra-high resolution. Another purpose of the present disclosure is to provide an electroluminescence display having a repair element that overlaps an emission area and does not damage the light emitting element disposed within the emission area.

In one embodiment, an electroluminescence display comprises: a pixel on a substrate, the pixel comprising a thin film transistor and a light emitting diode, the thin film transistor including a semiconductor layer, a gate electrode, a source electrode, and a drain electrode, and the light emitting diode including an anode electrode that is connected to the thin film transistor; a repair element having a welding part that is configured to be connected to the thin film transistor; a planarization layer on the repair element, the planarization layer including a depression that overlaps the welding part of the repair element; and an organic material in the depression of the planarization layer, wherein the anode electrode includes a first anode electrode layer and a second anode electrode layer, the first anode electrode layer including a portion that is disposed in the depression of the planarization layer, and the second anode electrode layer being on the first anode electrode layer and the organic material.

In one embodiment, an electroluminescence display comprises: a first pixel on a substrate, the first pixel including a first thin film transistor and a first light emitting element that is connected to the first thin film transistor, the first light emitting element including a first anode electrode having a first lower electrode layer and a first upper electrode layer that is on the first lower electrode layer; a second pixel on the substrate, the second pixel including a second thin film transistor and a second light emitting element that is connected to the second thin film transistor, the second light emitting element including a second anode electrode having a second lower electrode layer and a second upper electrode layer that is on the second lower electrode layer; a planarization layer on the first thin film transistor and the second thin film transistor, the planarization layer including a first depression and a second depression; a first organic material in the first depression; a second organic material in the second depression; and a repair element having a first welding part and a second welding part, the first welding part overlapping the first light emitting element and the first depression, and the second welding part overlapping the second light emitting element and the second depression, wherein a portion of the first lower electrode layer is disposed in the first depression and the first upper electrode layer is on the first lower electrode and the first organic material, and a portion of the second lower electrode layer is disposed in the second depression and the second upper electrode layer is on the second lower electrode and the second organic material.

In one embodiment, an electroluminescence display comprises: a first pixel on a substrate, the first pixel comprising a first thin film transistor and a first light emitting diode that is connected to the first thin film transistor, the first light emitting diode including a first anode electrode; a repair line on the substrate that extends to the first pixel; a first repair electrode overlapping the repair line, the first repair electrode connected to the first thin film transistor; a planarization layer on the thin film transistor, the repair line, and the first repair electrode, the planarization layer including a first depression that overlaps the repair line and the first repair electrode; a first organic material in the first depression, wherein a first portion of the first anode electrode is disposed in the first depression such that the first portion of first anode electrode overlaps the repair line and the first repair electrode, and a second portion of the first anode electrode is disposed on the first organic material and the first portion of the first anode electrode without being disposed in the first depression.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
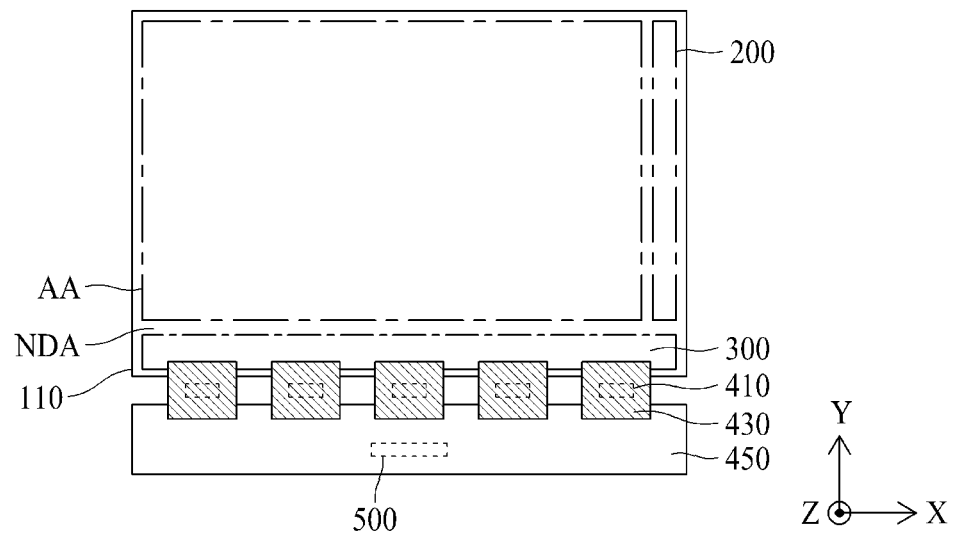
FIG. 1 is a plane view illustrating a schematic structure of an electroluminescence display according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

The shapes, sizes, ratios, angles, numbers, and the like, which are illustrated in the drawings in order to describe various example embodiments of the present disclosure, are merely given by way of example. Therefore, the present disclosure is not limited to the illustrated details. Like reference numerals refer to like elements throughout the specification unless otherwise specified. In the following description, where the detailed description of the relevant known function or configuration may unnecessarily obscure an important point of the present disclosure, a detailed description of such known function of configuration may be omitted.

Reference will now be made in detail to the exemplary embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

In the case that "comprise," "have," and "include" described in the present specification are used, another part may also be present unless "only" is used. The terms in a singular form may include plural forms unless noted to the contrary.

In construing an element, the element is construed as including an error range although there is no explicit description.

In describing a positional relationship, for example, when the positional order is described as "on," "above," "below," and "next," the case of no contact there-between may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent,"

"next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as the first, the second, A, B, (a) and (b) may be used. These terms are only to distinguish the elements from other elements, and the terms do not limit the nature, order, sequence or number of the elements. When an element is described as being "linked", "coupled" or "connected" to another element that element may be directly connected to or connected to that other element, but indirectly unless otherwise specified. It is to be understood that other elements may be "interposed" between each element that may be connected to or coupled to.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, an example of a display apparatus according to the present disclosure will be described in detail with reference to the accompanying drawings. In designating reference numerals to elements of each drawing, the same components may have the same reference numerals as much as possible even though they are shown in different drawings.

Hereinafter, referring to attached figures, we will explain about the present disclosure, in detail. FIG. 1 is a diagram illustrating a schematic structure of an electroluminescence display according to the present disclosure. In FIG. 1, X-axis may be parallel to the extending direction of the scan line, Y-axis may be parallel to the extending direction of the data line, and Z-axis may represent the thickness direction of the display.

Referring to FIG. 1, the electroluminescence display comprises a substrate 110, a gate (or scan) driver 200, a data pad portion 300, a source driving IC (integrated circuit) 410, a flexible film 430, a circuit board 450, and a timing controller 500.

The substrate 110 may include an electrical insulating material or a flexible material. The substrate 110 may be made of a glass, a metal or a plastic, but it is not limited thereto. When the electroluminescence display is a flexible display, the substrate 110 may be made of the flexible material such as plastic. For example, the substrate 110 may include a transparent polyimide material.

The substrate 110 may include a display area AA and a non-display area NDA. The display area AA, which is an area for representing the video images (e.g., displaying video images), may be defined as the majority middle area of the substrate 110, but it is not limited thereto. In the display area AA, a plurality of scan lines (or gate lines), a plurality of data lines and a plurality of pixels may be formed or disposed. Each of pixels may include a plurality of sub pixels. Each of sub pixels includes the scan line and the data line, respectively.

The non-display area NDA, which is an area that does not represent (e.g., does not display) the video images, may be disposed adjacent to the display area AA. For example, the non-display area NDA may be defined at the circumference areas of the substrate 110 surrounding all or some of the display area AA. In the non-display area NDA, the gate driver 200 and the data pad portion 300 may be formed or disposed.

The gate driver 200 may supply the scan (or gate) signals to the scan lines according to the gate control signal received from the timing controller 500. The gate driver 200 may be formed at the non-display area NDA at any one outside of the display area AA on the substrate 110, as a GIP (gate driver in panel) type. GIP type means that the gate driver 200 is directly formed on the substrate 110 in one embodiment.

The data pad portion 300 may supply the data signals to the data line according to the data control signal received from the timing controller 500. The data pad portion 300 may be made as a driver chip and mounted on the flexible film 430. Further, the flexible film 430 may be attached at the non-display area NDA at any one outside of the display area AA on the substrate 110, as a TAB (tape automated bonding) type.

The source driving IC 410 may receive the digital video data and the source control signal from the timing controller 500. The source driving IC 410 may convert the digital video data into the analog data voltages according to the source control signal and then supply that to the data lines. When the source driving IC 410 is made as a chip type, it may be installed on the flexible film 430 as a COF (chip on film) or COP (chip on plastic) type.

The flexible film 430 may include a plurality of first link lines connecting the data pad portion 300 to the source driving IC 410, and a plurality of second link lines connecting the data pad portion 300 to the circuit board 450. The flexible film 430 may be attached on the data pad portion 300 using an anisotropic conducting film, so that the data pad portion 300 may be connected to the first link lines of the flexible film 430.

The circuit board 450 may be attached to the flexible film 430. The circuit board 450 may include a plurality of circuits implemented as the driving chips. For example, the circuit board 450 may be a printed circuit board or a flexible printed circuit board.

The timing controller 500 may receive the digital video data and the timing signal from an external system board through the line cables of the circuit board 450. The timing controller 500 may generate a gate control signal for controlling the operation timing of the gate driver 200 and a source control signal for controlling the source driving IC 410, based on the timing signal. The timing controller 500 may supply the gate control signal to the gate driver 200 and supply the source control signal to the source driving IC 410. Depending on the product types, the timing controller 500 may be formed as one chip with the source driving IC 410 and mounted on the substrate 110.

First Embodiment

Hereinafter, referring to FIGS. 2 to 4, a first embodiment of the present disclosure will be explained.

Figure 2:
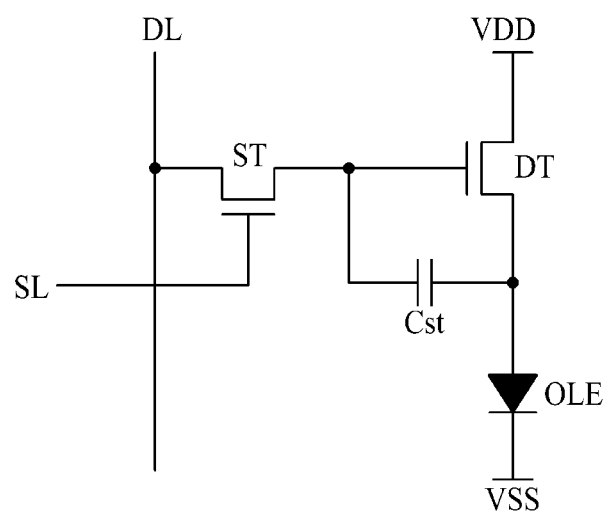
FIG. 2 is a circuit diagram illustrating a structure of one pixel according to one embodiment of the present disclosure.

FIG. 2 is a circuit diagram illustrating a structure of one pixel according to the present disclosure. FIG. 3 is a plan view illustrating a structure of the pixels disposed in the electroluminescence display having a repair element according to the first embodiment of the present disclosure. FIG. 4 is a cross-sectional view along to cutting line IT in FIG. 3, for illustrating the structure of the electroluminescence display having a repair element according to the first embodiment of the present disclosure.

Figure 3:
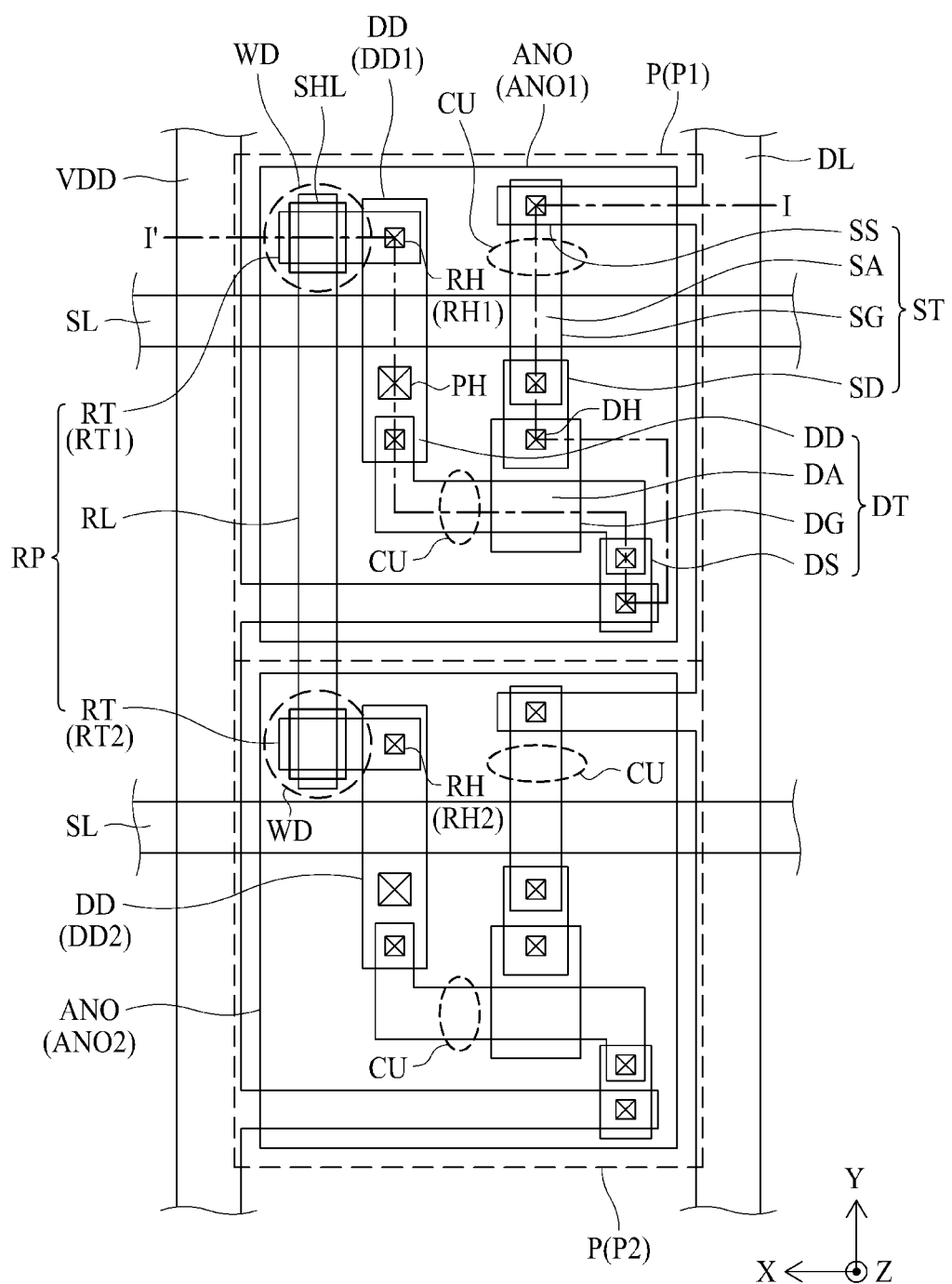
FIG. 3 is a plan view illustrating a structure of the pixels disposed in the electroluminescence display having a repair element according to one embodiment of the present disclosure.
Figure 4:
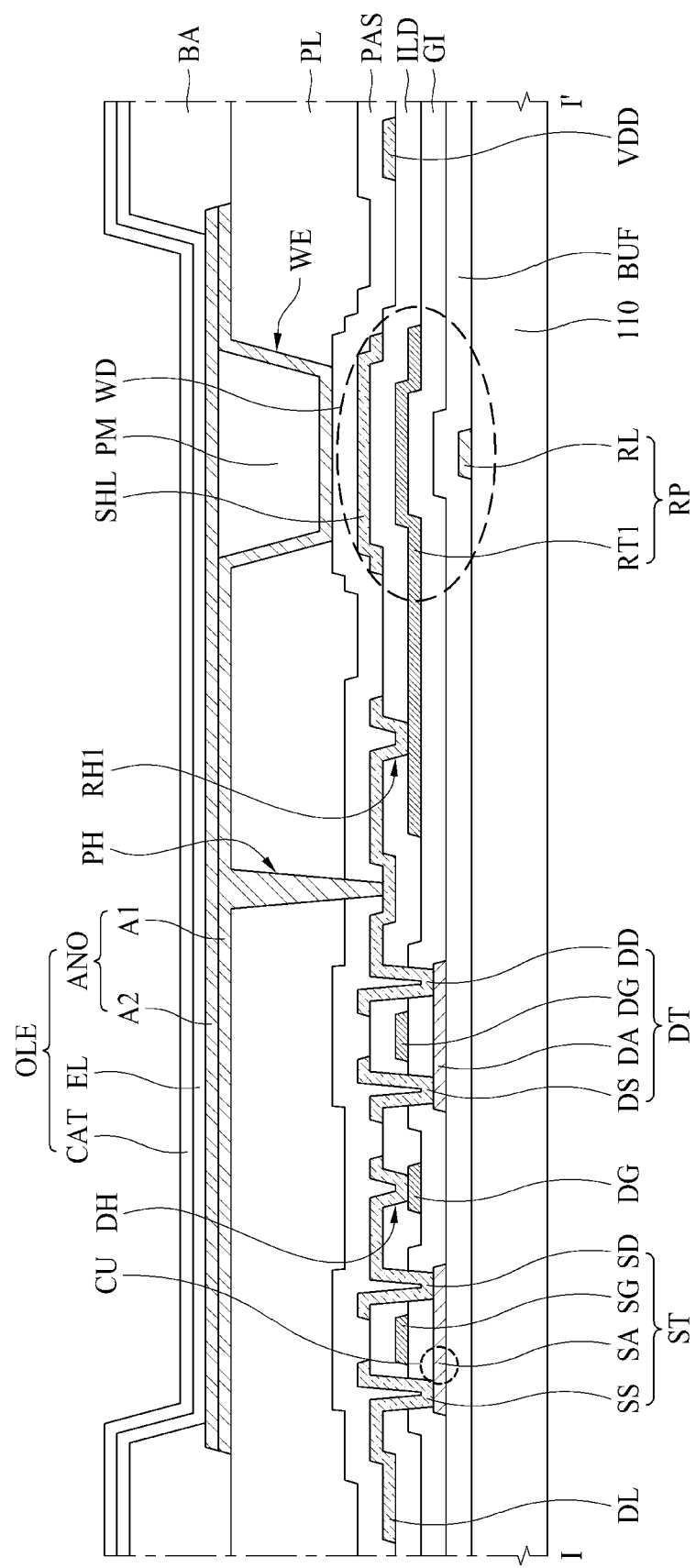
FIG. 4 is a cross-sectional view along to cutting line IT in FIG. 3, for illustrating the structure of the electroluminescence display having a repair element according to one embodiment of the present disclosure.

Referring to FIGS. 2 to 4, one-pixel of the light emitting display may be defined by a scan line SL, a data line DL, and a driving current line VDD. One pixel of the light emitting display may include a switching thin film transistor ST, a driving thin film transistor DT, a light emitting diode OLE, and a storage capacitance Cst. The driving current line VDD may be supplied with a high-level voltage for driving the light emitting diode OLE. The light emitting diode OLE may be considered to be a light emitting element.

For example, the switching thin film transistor ST may be disposed at the portion where the scan line SL and the data line DL cross each other. The switching thin film transistor ST may include a switching gate electrode SG, a switching source electrode SS and a switching drain electrode SD. The switching gate electrode SG may be connected to the scan line SL, or be one portion of the scan line SL as shown in FIG. 3. The switching source electrode SS may be connected to the data line DL and the switching drain electrode SD may be connected to the driving thin film transistor DT. By supplying the data signal to the driving thin film transistor DT, the switching thin film transistor ST may play a role of selecting a pixel which would be driven.

The driving thin film transistor DT may play a role of driving the light emitting diode OLE of the selected pixel by the switching thin film transistor ST. The driving thin film transistor DT may include a driving gate electrode DG, a driving source electrode DS and a driving drain electrode DD. The driving gate electrode DG may be connected to the switching drain electrode SD of the switching thin film transistor ST. For example, the switching drain electrode SD may be connected to the driving gate electrode DG via a drain contact hole DH penetrating the intermediate insulating layer ILD covering the driving gate electrode DG. The driving source electrode DS may be connected to the driving current line VDD, and the driving drain electrode DD may be connected to an anode electrode ANO of the light emitting diode OLE. A storage capacitance Cst may be disposed between the driving gate electrode DG of the driving thin film transistor DT and the anode electrode ANO of the light emitting diode OLE. In FIGS. 3 and 4, the storage capacitance Cst is not shown in order to avoid the complexity of the drawings.

The driving thin film transistor DT may be disposed between the driving current line VDD and the light emitting diode OLE. The driving thin film transistor DT may control the amount of electric current flowing to the light emitting diode OLE from the driving current line VDD according to the voltage level of the driving gate electrode DG connected to the switching drain electrode SD of the switching thin film transistor ST.

FIG. 4 shows that the thin film transistors ST and DT are formed in a top-gate structure. In one embodiment, the top gate electrode means that the gate electrodes SG and DG are formed on the semiconductor layers SA and DA. For example, in the top gate structure, the semiconductor layers SA and DA are first formed on the substrate 110, and the gate electrodes SG and DG are formed on the gate insulating layer GI covering the semiconductor layers SA and DA. However, it is not limited thereto. For another example, the electroluminescence display according to the present disclosure may have the bottom gate structure. In the bottom gate structure, the gate electrode may be first formed on the substrate and then the semiconductor layer is formed on the gate insulating layer covering the gate electrode.

In addition, for the case of the top gate structure shown in FIG. 4, an intermediate insulating layer ILD may be deposited on the gate electrodes SG and DG. The data line DL, the source electrodes SS and DS, the drain electrodes SD and DD, and the driving current line VDD are disposed on the intermediate insulating layer ILD.

The light emitting diode OLE may include an anode electrode ANO, an emission layer EL and a cathode electrode CAT. The light emitting diode OLE may emit the light according to the amount of the electric current controlled by the driving thin film transistor DT. In the light emitting diode OLE, the amount of light emitted is controlled by the current controlled by the driving thin film transistor DT, so that the luminance of the electroluminescence display may be adjusted. The anode electrode ANO of the light emitting diode OLE is connected to the driving drain electrode DD of the driving thin film transistor DT, and the cathode electrode CAT is connected to the low power supply line VSS to which a low potential voltage is supplied. In other word, the light emitting diode OLE may be driven by the voltage differences between the low-level voltage and the high-level voltage controlled by driving thin film transistor DT.

A passivation layer PAS is deposited on the surface of the substrate 110 having the thin film transistors ST and DT. In one embodiment, the passivation layer PAS is made of inorganic materials such as silicon oxide or silicon nitride. A planarization layer PL is deposited on the passivation layer PAS. The planarization layer PL may be a film layer for flattening the non-uniform (or uneven) surface of the substrate 110 on which the thin film transistors ST and DT are formed. In order to make the uneven surface condition be uniformed, the planarization layer PL may be made of organic materials. The passivation layer PAS and the planarization layer PL have a pixel contact hole PH exposing some of the driving drain electrode DD of the driving thin film transistor DT.

An anode electrode ANO is formed on the planarization layer PL. The anode electrode ANO is connected to the driving drain electrode DD of the driving thin film transistor DT via the pixel contact hole PH. The anode electrode ANO may have different structure according to the emission type of the light emitting diode OLE. In the example of the bottom emission type in which the light is emitted to the direction where the substrate 110 is disposed, the anode electrode ANO may be made of transparent conductive materials. In an example of the top emission type in which the light is emitted to the direction opposite the substrate 110, the anode electrode ANO may be made of metal materials having excellent light reflectance. In another embodiment, the anode electrode ANO may include an opaque metal material.

In one embodiment of the present disclosure, the top emission type is suitable for realization of ultra-high resolution. In the top emission type, the anode electrode ANO has a maximum area in a pixel area defined by the data line DL, the driving current line VDD and the scan line SL. In this case, the thin film transistors ST and DT may be disposed to overlap with the anode electrode ANO under the anode electrode ANO. In addition, the data line DL, the driving current line VDD and the scan line SL may also partially overlap the anode electrode ANO. In FIG. 3, in order to avoid the complexity of the drawing, the anode electrode ANO is illustrated as being not overlapped with the lines.

A bank BA is formed on the anode electrode ANO. The bank BA may cover the circumference areas of the anode electrode ANO, and expose most of middle portions of the anode electrode ANO. The exposed area of the anode electrode ANO by the bank BA may be defined as an emission area of the pixel.

In the top emission type, the thin film transistors ST and DT may be disposed as being overlapped with the emission area. In addition, some portions of the data line DL, the driving current line VDD and the scan line SL may be overlapped with the emission area.

An emission layer EL is deposited on the anode electrode ANO and the bank BA. The emission layer EL may be deposited on the whole of the display area AA as covering the anode electrode ANO and the bank BA. For an embodiment, the emission layer EL may include two or more emission layers which are vertically stacked for combining and emitting white light. For example, the emission layer EL may include a first emission layer and a second emission layer for combining a first color light and a second color light to emit white light.

For another embodiment, the emission layer EL may include any one of blue emission layer, green emission layer and red emission layer for providing color light allocated at the pixel. In this case, the emission layer EL may be disposed as being isolated within each emission area defined by the bank BA. In addition, the light emitting diode OLE may further include functional layers for enhancing the emission efficiency and/or the light time of the emission layer EL.

A cathode electrode CAT is deposited on the emission layer EL as being in surface-contact with the emission layer EL. The cathode electrode CAT is deposited as covering whole surface of the substrate 110 as being in connected with the emission layer EL disposed at all pixels. For the top emission type, it is preferable that the cathode electrode CAT may be made of transparent conductive material such as indium-tin-oxide (ITO) or indium-zinc-oxide (IZO).

The electroluminescence display according to one embodiment of the present disclosure may further comprise a repair element RP. The repair element RP may be a structure to make any defected pixel operate like normal functioning pixel that emits light without darkening the defected pixel.

The repair element RP may include a repair line RL and a repair electrode RT according to one embodiment. The repair line RL may have a line segment shape disposed between two adjacent pixels P. One end (e.g., a first end) of the repair line RL may be disposed at any one pixel and another end (e.g., a second end) of the repair line RL may be disposed at another neighboring pixel.

Referring to FIG. 3, the electroluminescence display according to the present disclosure includes a plurality of pixels P disposed on a substrate 110 in a matrix manner. For example, as shown in FIG. 3, a first pixel P1 and a second pixel P2 may be disposed adjacent to each other along the Y-axis. The first pixel P1 may include a first anode electrode ANO1, the second pixel P2 may include a second anode electrode ANO2. Each pixels P1 and P2 may include a thin film transistor and signal lines.

The repair element RP may include a repair line RL, a first repair electrode RT1, and a second repair electrode RT2 in one embodiment. The repair line RL may be disposed across the first pixel P1 and the second pixel P2. The first repair electrode RT1 may be disposed in the first pixel P1, and the second repair electrode RT2 may be disposed in the second pixel P2.

The first repair electrode RT1 may be connected to a first driving drain electrode DD1 connected to the first anode electrode ANO1 allocated to the first pixel P1. In particular, a first end of the first repair electrode RT1 may contact the first driving drain electrode DD1 via a first repair contact hole RH1 formed at the intermediate insulating layer ILD covering the first repair electrode RT1. A second end of the first repair electrode RT1 may overlap the repair line RL in vertical structure with the buffer layer BUF and the gate insulating layer GI interposed there-between.

The second repair electrode RT2 may be connected to a second driving drain electrode DD2 connected to the second anode electrode ANO2 allocated to the second pixel P2. In particular, a first end of the second repair electrode RT2 may contact the second driving drain electrode DD2 via a second repair contact hole RH2 formed at the intermediate insulating layer ILD covering the second repair electrode RT2. A second end of the second repair electrode RT2 may overlap the repair line RL in vertical structure with the buffer layer BUF and the gate insulating layer GI interposed there-between.

A first end of the repair line RL may overlap the second end of the first repair electrode RT1, and a second end of the repair line RL may overlap the second end of the second repair electrode RT2. When any one pixel of the first pixel P1 and the second pixel P2 may be defected, during a repair process, both ends of the repair line RL may be connected to the first repair electrode RT1 and the second repair electrode RT2, respectively. Further, the cutting part CU in a pixel having the defects may be cut off. As a result, any defective pixel among the first pixel P1 and the second pixel P2 may be driven by a normal pixel.

Referring to FIG. 3, the welding part WD may be defined in each of the first pixel P1 and the second pixel P2. In addition, the cutting part CU may be defined at the switching semiconductor layer SA of the switching thin film transistor ST or the driving semiconductor layer DA of the driving thin film transistor DT in the first pixel P1 and the second pixel P2. When any one of the first pixel P1 and the second pixel P2 is defective, a cutting process may be performed at one of the cutting part CU of the defective pixel, and welding process may be performed at the welding part WD of the both the defective pixel and the normal pixel.

Referring to FIG. 4, the repair line RL may be first formed on the substrate 110. In particular, the repair line RL may include a metal material. In some examples, the repair line RL may have a double layered structure including two metal layers. In particular, the repair line RL may have a reverse-tapered structure in a cross-sectional view.

The repair line RL may be covered by the buffer layer BUF disposed over the entire surface of the substrate 110. The semiconductor layers SA and DA are formed on the buffer layer BUF. The semiconductor layers SA and DA may be covered by the gate insulating layer GI disposed over the entire surface of the substrate 110. The gate electrodes SG and DG are formed on the gate insulating layer GI as being overlapped with semiconductor layers SA and DA, respectively. The repair electrode RT may be formed on the same layer with the gate electrode SG and DG.

The repair electrode RT may have a short line segment structure having a first end and a second end. The first end may be connected to the driving drain electrode DD that is connected to the anode electrode ANO disposed in the pixel. The second end may extend from the first end and overlap one end of the repair line RL.

The gate electrodes SG and DG and the repair electrode RT may be covered by the intermediate insulating layer ILD disposed over the entire surface of the substrate 110. The source electrodes SS and DS, the drain electrodes SD and DD, the data line DL and the driving current line VDD are formed on the intermediate insulating layer ILD. The intermediate insulating layer ILD may include a repair contact hole RH exposing the end of the repair electrode RT. The driving drain electrode DD may be extended to the end of the repair electrode RT to be connected to the repair electrode RT via the repair contact hole RH.

In addition, a repair shield layer SHL may be formed on the intermediate insulating layer ILD and overlap the repair electrode RT. The repair shield layer SHL may include the same material and on the same layer with the driving drain electrode DD. The repair shield layer SHL may have an island shape fully covering the second end of the repair electrode RT overlapped with the end of the repair line RL. When performing the welding process at the first end of the repair line RL and the second end of the repair electrode RT, the repair shield layer SHL may be a metal layer for protecting the welding heat from transferring to the light emitting diode OLE disposed upward.

The passivation layer PAS is disposed on the substrate 110 having the source electrodes SS and DS, the drain electrodes SD and DD, the data line DL, the driving current line VDD and the repair shield layer SHL. The planarization layer PL is disposed on the passivation layer PAS.

The portion where the end of the repair line RL is overlapped with the second end of the repair electrode RT or where the repair shield layer SHL is disposed may be defined as the welding part WD. The welding part WD may be disposed adjacent to the switching semiconductor layer SA of the switching thin film transistor ST. The cutting part CU may be defined at the switching semiconductor layer SA adjacent to the welding part WD. However, it is not limited thereto. The cutting part CU may be defined at the driving thin film transistor DT.

A depression WE may be formed by removing a portion of the planarization layer PL disposed at the welding part WD. The anode electrode ANO is disposed on the planarization layer PL having the depression WE. The anode electrode ANO may include a first anode electrode layer A1 (e.g., a first anode portion) and the second anode electrode layer A2 (e.g., a second anode portion) sequentially stacked. In particular, the first anode electrode layer A1 may be stacked while in surface contact with the surface of the planarization layer PL on which the depression WE is formed. Therefore, the first anode electrode layer A1 may be formed as reproducing the cross-sectional shape of depression WE. The depression WE may be filled with an organic material PM. The organic material filling in the depression WE may be the same material with the planarization layer PL in one embodiment.

The second anode electrode layer A2 is stacked on the surfaces of the first anode electrode layer A1 and the depression WE filled with the organic material PM. The first anode electrode layer A1 and the second anode electrode layer A2 may be in surface contact with each other except for the depression WE.

Referring to the cross-sectional structure of the welding part WD, the repair line RL, the buffer layer BUF, the gate insulating layer GI, the repair electrode RT, the intermediate insulating layer ILD, the shield layer SHL, the passivation layer PAS, the first anode electrode layer A1, the organic material PM filling the depression WE, and the second anode electrode layer A2 are stacked sequentially. On the second anode electrode layer A2, the emission layer EL and the cathode electrode CAT may be further stacked. At the welding part WD, the repair element RP may be covered by the shield layer SHL, and the first anode electrode layer A1 is stacked on the shield layer SHL.

The repair element RP may be referred to an element that cuts connectivity with a thin film transistor allocated on an anode electrode of a defective pixel, and connects to a driving thin film transistor allocated to a neighboring normal pixel, when a defect occurs. Hereinafter, referring to FIGS. 5 to 8, a structure in which a defect is resolved by connecting to a normal pixel when a defective pixel occurs will be explained.

Figure 5:
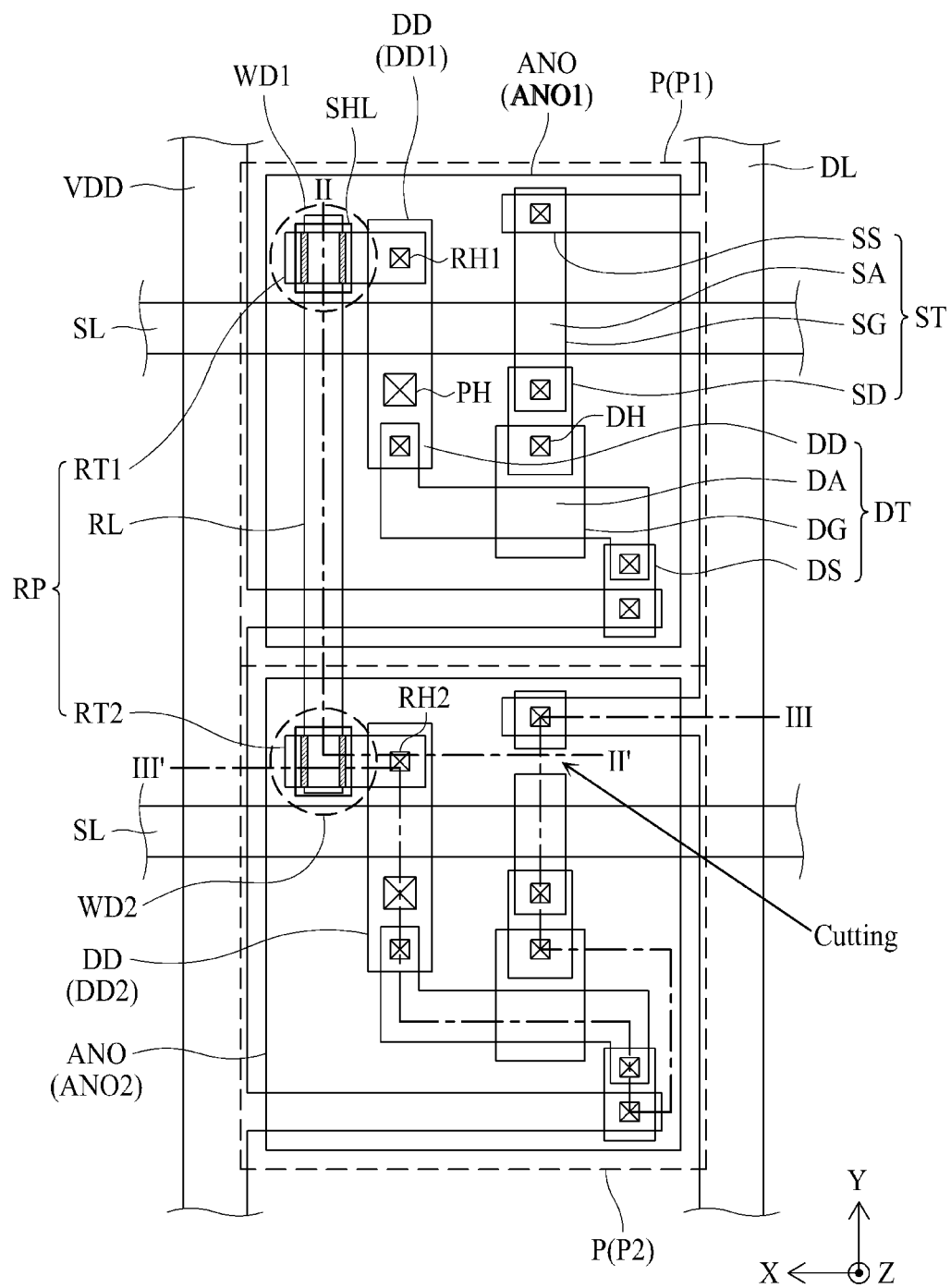
FIG. 5 is a plane view illustrating a structure after conducting welding and cutting process in the electroluminescence display having a repair structure according to a first embodiment of the present disclosure.
Figure 6:
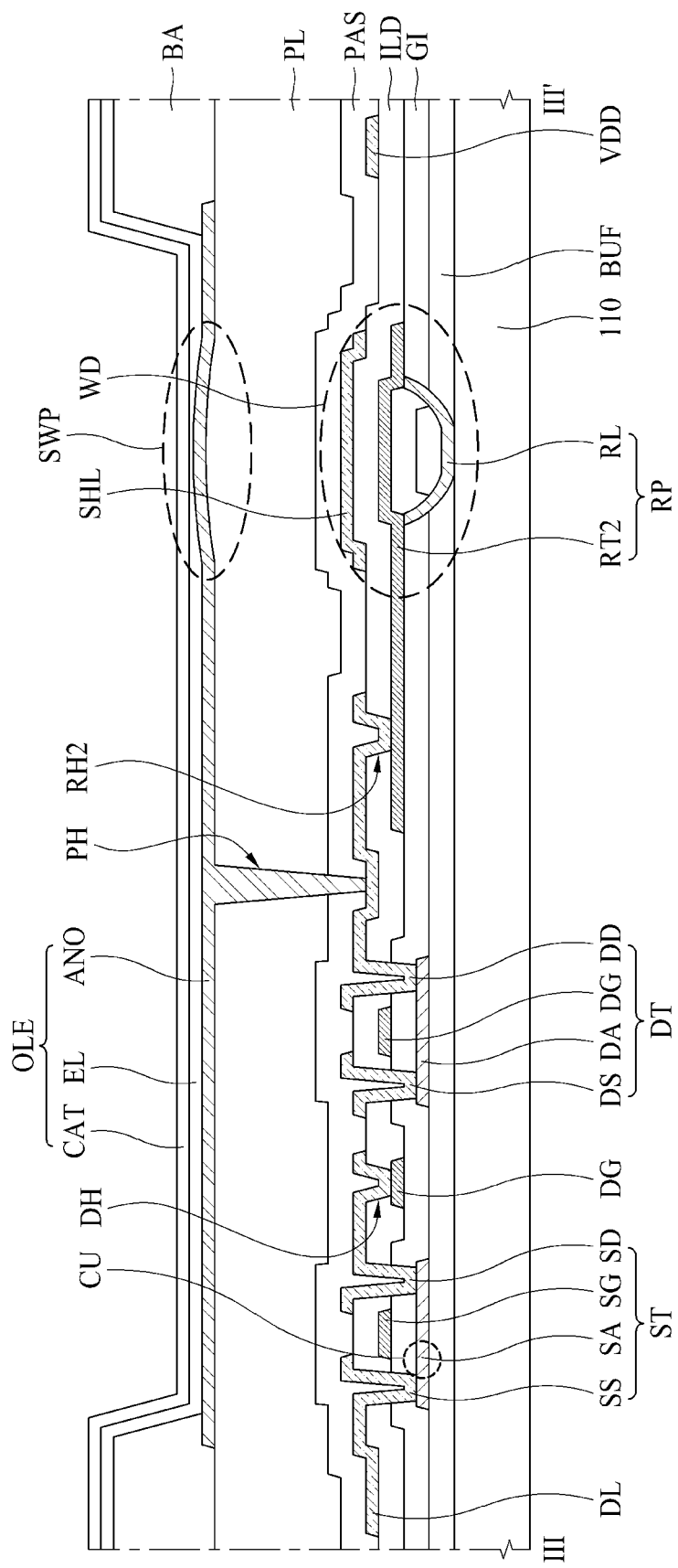
FIG. 6 is a cross-sectional view illustrating a structure after welding and cutting are performed in an electroluminescence display according to a comparative example in which a depression is not included.
Figure 7A:
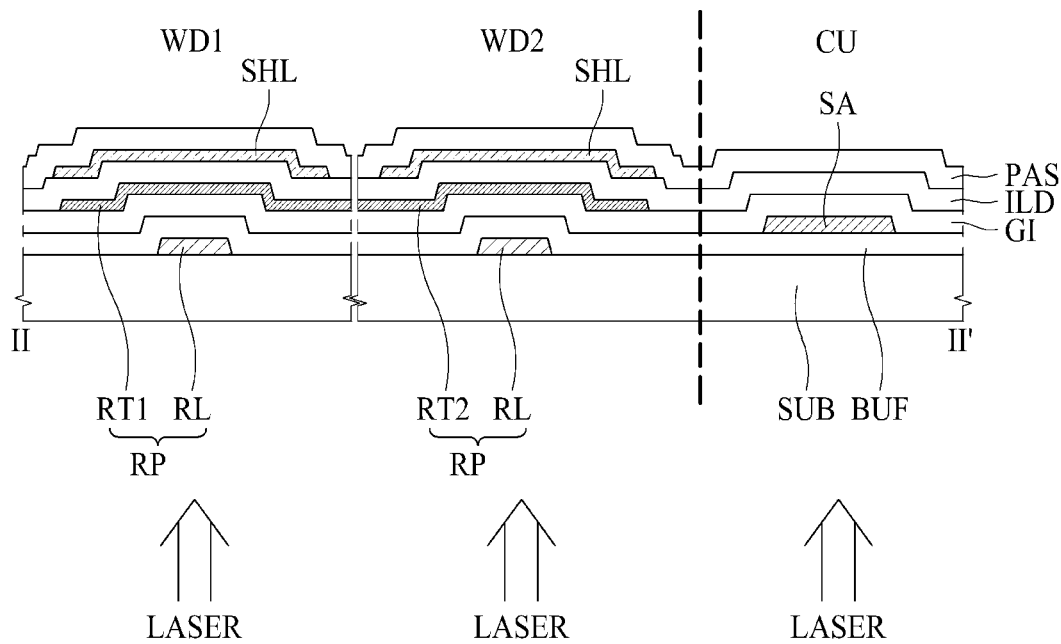
FIG. 7A is a cross-sectional view along line II-II' in FIG. 5, for illustrating a structure of the welding part and cutting part, before conducting the repair process, in the electroluminescence display according to the first embodiment of the present disclosure.
Figure 7B:
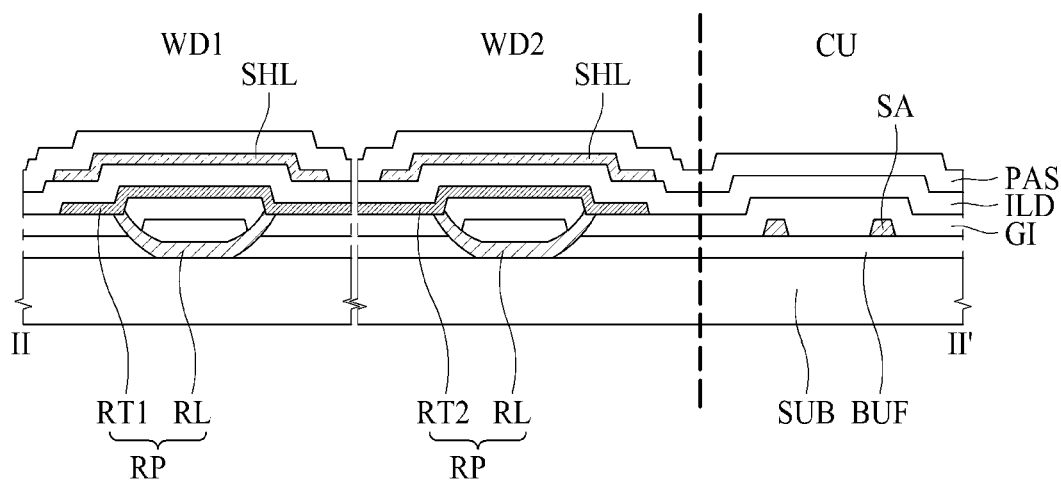
FIG. 7B is a cross-sectional view along line II-II' in FIG. 5, for illustrating a structure of the welding part and cutting part, after conducting the repair process, in the electroluminescence display according to the first embodiment of the present disclosure.
Figure 8:
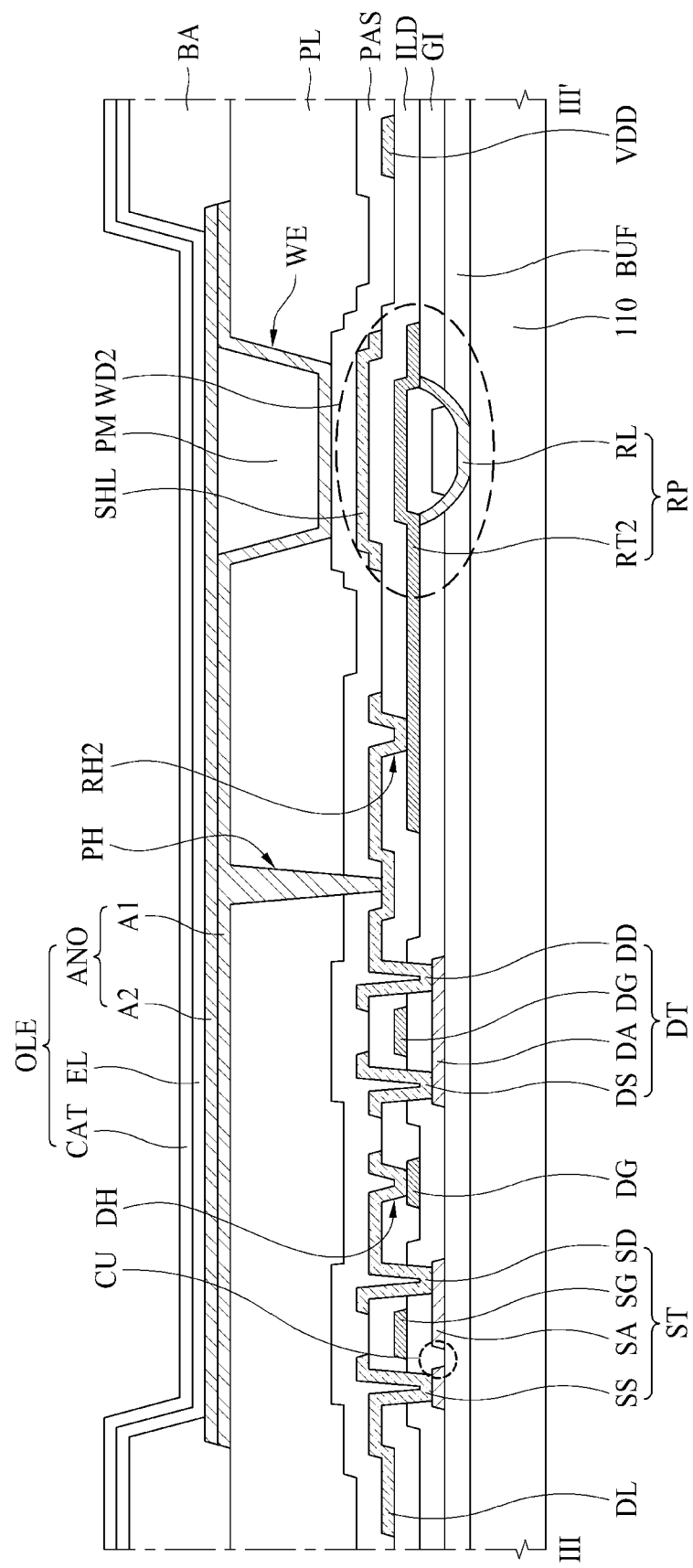
FIG. 8 is a cross-sectional view along line in FIG. 5, for illustrating a structure, after conducting the welding and cutting process, in the electroluminescence display according to the first embodiment of the present disclosure.

FIG. 5 is a plane view illustrating a structure after conducting welding and cutting process in the electroluminescence display having a repair structure according to the first embodiment of the present disclosure. FIG. 6 is a cross-sectional view illustrating a structure after welding and cutting are performed in an electroluminescence display according to a comparative example in which a depression is not included. FIG. 7A is a cross-sectional view along line II-II' in FIG. 5, for illustrating a structure of the welding part and cutting part, before conducting the repair process, in the electroluminescence display according to the first embodiment of the present disclosure. FIG. 7B is a cross-sectional view along line II-II' in FIG. 5, for illustrating a structure of the welding part and cutting part, after conducting the repair process, in the electroluminescence display according to the first embodiment of the present disclosure. FIG. 8 is a cross-sectional view along line in FIG. 5, for illustrating a structure, after conducting the welding and cutting process, in the electroluminescence display according to the first embodiment of the present disclosure.

The electroluminescence display according to the present disclosure may comprise a plurality of pixels P disposed on the substrate 110 in a matrix manner. For example, as shown in FIG. 5, a first pixel P1 and the second pixel may be disposed adjacent to each other along the Y-axis. The first pixel P1 may include a first anode electrode ANO1, and the second pixel P2 may include a second anode electrode ANO2. Since the thin film transistors and the signal lines included in each of the pixels P1 and P2 may be the same as described above, a detailed description thereof may be not duplicated.

The repair element RP may include a repair line RL, a first repair electrode RT1 and a second repair electrode RT2. The repair line RL may be disposed across the first pixel P1 and the second pixel P2. The first repair electrode RT1 may be disposed in the first pixel P1, and the second repair electrode RT2 may be disposed in the second pixel P2.

The first repair electrode RT1 may be connected to the first driving drain electrode DD1 connected to the first anode electrode ANO1 allocated to the first pixel P1. In particular, a first end of the first repair electrode RT1 may be connected to the first driving drain electrode DD1 via a first repair contact hole RH1 formed at the intermediate insulating layer ILD covering the first repair electrode RT1. A second end of the first repair electrode RT1 may overlap the repair line RL with a buffer layer BUF and the gate insulating layer GI there-between in a cross-sectional view.

The second repair electrode RT2 may be connected to the second driving drain electrode DD2 connected to the second anode electrode ANO2 allocated to the second pixel P2. In particular, a first end of the second repair electrode RT2 may be connected to the second driving drain electrode DD2 via a second repair contact hole RH2 formed at the intermediate insulating layer ILD covering the second repair electrode RT2. A second end of the second repair electrode RT2 may overlap the repair line RL with the buffer layer BUF and the gate insulating layer GI there-between in the cross-sectional view.

The first end of the repair line RL may be overlapped with the second end of the first repair electrode RT1, and the second end of the repair line RL may be overlapped with the second end of the second repair electrode RT2. When any one of the first pixel P1 and the second pixel P2 is defective, using the repair process, both ends of the repair line RL may be connected to the first repair electrode RT1 and the second repair electrode RT2, respectively. In the repair process, using a laser having high energy in the 1066 nm wavelength band, the first repair electrode RT1 and the second repair electrode RT2 may be melted and physically and electrically connected to the repair line RL.

In addition, the connectivity may be cut off at the cutting part CU in the defective pixel. As a result, the defective pixel among the first pixel P1 and the second pixel P2 may be driven by the normal pixel. In the cutting process, the semiconductor layer SA or DA may be cut out using a laser with low energy in the 266 nm wavelength band.

For example, the first pixel P1 may be a normal pixel, and the second pixel P2 may be a defective pixel. The defective pixel may be in a state in which the anode electrode ANO cannot be normally driven because a defect occurs in the switching thin film transistor ST or the driving thin film transistor DT. In this case, the second pixel P2 having the defect may be darkened. This is a method of disabling the switching thin film transistor ST or the driving thin film transistor DT, which is an element driving the second anode electrode ANO2 disposed in the second pixel P2. Here, in the cross-sectional view, the thin film transistor ST or DT may be disabled by cutting a part of the switching semiconductor layer SA or the driving semiconductor layer DA located closest to the substrate 110.

In the present disclosure, rather than darkening the defective pixel, a method of connecting the driving thin film transistor of a neighboring normal pixel and the anode electrode of the defective pixel is used. To do so, as shown in FIG. 5, a laser is irradiated to a part of the switching semiconductor layer SA of the switching thin film transistor ST disposed in the defective second pixel P2 to cut the switching semiconductor layer SA. Here, a laser having low energy in the 266 nm wavelength band is used.

On the other hand, a laser having high energy in the 1066 nm wavelength band may be irradiated to the first welding part WD1 in which the second end of the first repair electrode RT1 and the first end of the repair line RL overlap each other in the first pixel P1. As a result, the repair line RL is melted, and then passes through the gate insulating layer GI and the intermediate insulating layer ILD stacked thereon to be physically and electrically connected to the second end of the first repair electrode RT1 disposed thereon.

In addition, the laser having high energy in the 1066 nm wavelength band may be irradiated to the second welding part WD2 in which the second end of the second repair electrode RT2 and the second end of the repair line RL overlap each other in the second pixel P2. As a result, the repair line RL is melted, and then passes through the gate insulating layer GI and the intermediate insulating layer ILD stacked thereon to be physically and electrically connected to the second end of the second repair electrode RT2 disposed thereon.

Consequently, in the second pixel P2 in which the defect occurs, the switching thin film transistor ST that operates the driving thin film transistor DT for driving the second anode electrode ANO2 is disabled. At the same time, the second anode electrode ANO2 is connected to the first driving drain electrode DD1 disposed in the first pixel P1 through the repair element RP. Therefore, the second pixel P2 may be in the same operating state as the first pixel P1.

Since a defective pixel is connected to a neighboring normal pixel and driven by the repair element RP rather than darkening the defective pixel, it is possible to prevent or at least reduce and solve the deterioration of video image quality due to the defective pixel.

In particular, when repairing defective pixels, a laser having low energy in the 266 nm wavelength band is used to cut the semiconductor layer, and a laser having thigh energy in the 1066 nm wavelength band is used to connect the repair line and the repair electrode. The electroluminescence display may have a top emission type, so both the welding part WD and cutting part CU for repair process may be disposed overlapping the anode electrode ANO, in particular, the emission area.

With this structure, as irradiating the laser from the lower direction of the substrate 110, when the energy of laser is too high, the light emitting diode may be damaged by the thermal energy of the laser. For example, when the 1066 nm wavelength LASER is used in the welding process, a swelling phenomenon in which the planarization layer PL deposited between the anode electrode ANO and the repair electrode RT may be swelled due to the high thermal energy. A problem may occur in the light emitting diode OLE due to the swelling part SWP in which the swelling phenomenon has occurred.

Referring to FIG. 6, the planarization layer PL is disposed between the repair electrode RT and the anode electrode ANO. When the repair line RL and the repair electrode RT are welded by irradiating the laser with high energy in the 1066 nm wavelength band, the thermal energy may be concentrated at some portions of the planarization layer PL overlapped with the repair electrode RT, so that the portions may swell. Even though the shield layer SHL may be disposed between the repair electrode RT and the planarization layer PL, the shield layer SHL may not dissipate the thermal energy quickly over a large area, because the size of the shield layer SHL may be slightly larger than the end of the repair line RL.

Therefore, at the swelling part SWP corresponding to the area of the end of the repair electrode RT, the gap between the anode electrode ANO and the cathode electrode CAT may be closer than other portions. As the result, as driving the light emitting diode OLE, the luminance may be abnormally increased in the swelling part SWP, which may cause the luminance imbalance or non-uniformity. When the swelling phenomenon may be more severe, the anode electrode ANO and the cathode electrode CAT may become too close to each other, and a short circuit may be occurred there-between. Although the repair process is performed, a problem may occur in that the defective pixels are not restored, and defects occur even in normal pixels.

On the other hand, the electroluminescence display according to the present disclosure as shown in FIG. 4 may include the depression WE from which a part of the planarization layer PL stacked on the repair electrode RT may be removed. Therefore, the first anode electrode layer A1 may have a structure in which the first anode electrode layer A1 is stacked close to the repair electrode RT at the depression WE. With this structure, when a welding process is performed, the thermal energy applied to the repair electrode RT may be diffused to the entire area of the anode electrode ANO by the first anode electrode layer A1 before being transferred to the planarization layer PL. Accordingly, the thermal energy may be easily dissipated, and swelling caused by being concentrated to a portion of the planarization layer PL may not occur.

In addition, the depression WE may be filled with the organic material PM, and then the second anode electrode layer A2 is deposited thereon, so the upper surface of the anode electrode ANO may have a planarized condition. Therefore, the emission layer EL deposited on the anode electrode ANO may have even thickness without any defected portions.

Referring to FIG. 7A, a laser having low energy of 266 nm wavelength band may be irradiated to the cutting part CU, and a laser having high energy of 1066 nm wavelength band may be irradiated to the welding part WD. For example, the laser of 1066 nm wavelength band may be irradiated to the repair electrodes RT1 and RT2 disposed on the substrate 110, and the laser of 266 nm wavelength band may be irradiated to the switching semiconductor layer SA.

As the result, as shown in FIG. 7B, at the cutting part CU, the switching semiconductor layer SA may be cut out by the thermal energy. Even though there is not any metal shield layer overlapped with the switching semiconductor layer SA, since the energy of laser is low, the other layers may not be affected by the thermal energy. In some cases, the switching gate electrode or the switching source electrode may be included in the cutting part CU. Even though the switching gate electrode or switching source electrode may be melted and connected, there is no side effect since the connectivity of the semiconductor layer is cut out. At the welding part WD1 and WD2 in FIG. 7B, the repair line RL may be melted, and then penetrated through the gate insulating layer GI and the buffer layer BUF stacked on the repair line RL to be connected to the repair electrodes RT1 and RT2 disposed thereon.

Referring to FIG. 8 illustrating a structure after performing the repair process, the switching semiconductor layer SA is cut out at the cutting part CU, so that the light emitting diode OLE disposed in the defective second pixel P2 may be disconnected from the switching thin film transistor ST and the driving thin film transistor DT. At the welding part WD, the repair line RL may be connected to the first repair electrode RT1 and the second repair electrode RT2. Therefore, the second anode electrode ANO2 may be connected to and driven by the first driving drain electrode DD1 through the first repair electrode RT1, the repair line RL and the second repair electrode RT2.

In addition, even though a laser having a relatively high thermal energy is used at the welding part WD, the thermal energy concentrated in the welding part WD may be rapidly diffused through the first anode electrode layer A1 to the entire area of the anode electrode ANO, and then radiated out. Therefore, after performing the repair process, the damage due to a phenomenon in which some portions of the planarization layer PL swell up may not occur.

Second Embodiment

Figure 9:
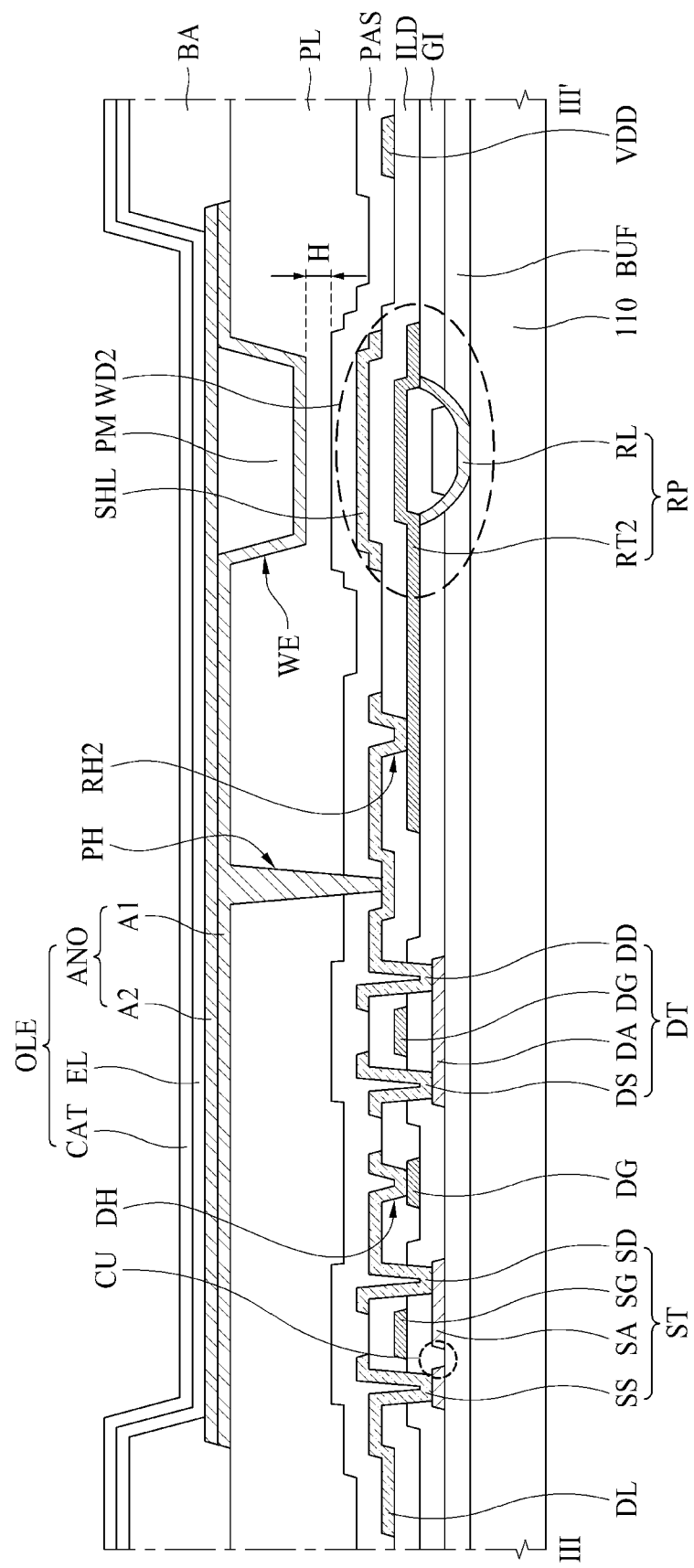
FIG. 9 is a cross-sectional view along line in FIG. 5, for illustrating a structure, after conducting the welding and cutting process, in the electroluminescence display according to a second embodiment of the present disclosure.

Hereinafter, referring to FIG. 9, an electroluminescence display according to the second embodiment of the present disclosure will be described. FIG. 9 is a cross-sectional view along line in FIG. 5, for illustrating a structure, after conducting the welding and cutting process, in the electroluminescence display according to the second embodiment of the present disclosure.

The electroluminescence display according to the second embodiment of the present disclosure may be very similar with that of the first embodiment. In the first embodiment, the depression WE may be formed by removing the whole thickness of the planarization layer PL at the welding part WD. In the second embodiment, the depression WE may be formed by removing some thickness of the planarization layer PL at the welding part WD.

For example, when the depression WE is formed by removing whole thickness of the planarization layer PL at the welding part WD as explained in the first embodiment, a parasitic capacitance may be formed between the first anode electrode layer A1 and the shield layer SHL, because the gap (or distance) between the first anode electrode layer A1 and the shield layer SHL is too short. When an unwanted parasitic capacitance occurs in the anode electrode ANO, there may be a positive effect, but it is not due to an exact design intention, it may have an adverse effect.

Accordingly, in the second embodiment, the electroluminescence display may have a structure in which a sufficient separation distance H between the bottom surface of the first anode layer A1 and the top surface of the passivation layer PAS is ensured so that parasitic capacitance does not occur between the first anode electrode layer A and the shield layer SHL or the repair electrode RT. For example, the depression WE may be formed by removing or patterning some thickness of the planarization layer PL at the welding part WD. On the planarization layer PL having the depression WE, the first anode electrode layer A1 is deposited. The first anode electrode layer A1 may be deposited as reproducing the cross-sectional profile of the depression WE. The depression WE is filled with the organic material PM on the first anode electrode layer A1. In one embodiment, the upper surface of the organic material PM may have the same height as the upper surface of the first anode electrode layer A1. The second anode electrode layer A2 is stacked on the first anode electrode layer A1 and the organic material PM.

The first anode electrode layer A1 and the second anode electrode layer A2 configure the anode electrode ANO. On the anode electrode ANO, a bank BA may be patterned to define an emission area. The emission layer EL is deposited on the anode electrode ANO and the bank BA. The cathode electrode CAT is deposited on the emission layer EL. Accordingly, the light emitting diode OLE may be formed as including the anode electrode ANO, the emission layer EL and the cathode electrode CAT.

The electroluminescence display according to the second embodiment may have the advantages of preventing or at least reducing parasitic capacitance from occurring further to the advantages of the electroluminescent display according to the first embodiment.

The features, structures, effects and so on described in the above examples of the present disclosure are included in at least one example of the present disclosure, and are not limited to only one example. Furthermore, the features, structures, effects and the likes explained in at least one example may be implemented in combination or modification with respect to other examples by those skilled in the art to which this disclosure belongs. Accordingly, contents related to such combinations and variations should be construed as being included in the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An electroluminescence display comprising:
a pixel on a substrate, the pixel comprising a thin film transistor and a light emitting diode, the thin film transistor including a semiconductor layer, a gate electrode, a source electrode, and a drain electrode, and the light emitting diode including an anode electrode that is connected to the thin film transistor;
a repair element having a welding part that is configured to be connected to the thin film transistor;
a planarization layer on the repair element, the planarization layer including a depression that overlaps the light emitting diode and the welding part of the repair element; and
an organic material in the depression of the planarization layer,
wherein the anode electrode includes a first anode electrode layer and a second anode electrode layer, the first anode electrode layer including a portion that is disposed in the depression of the planarization layer, and the second anode electrode layer on the first anode electrode layer and the organic material.

2. The electroluminescence display according to claim 1, wherein the repair element includes:
a repair line on the substrate; and
a repair electrode overlapping the repair line and the depression, the repair electrode on a buffer layer and a gate insulating layer that cover the repair line,
wherein the repair electrode is electrically connected to the drain electrode of the thin film transistor.

3. The electroluminescence display according to claim 2, wherein the pixel is defective and the semiconductor layer includes a cut such that the pixel is disabled, and the repair line is physically in contact with the repair electrode such that a portion of the repair line penetrates through a portion of the buffer layer and a portion of the gate insulating layer.

4. The electroluminescence display according to claim 3, wherein a physical connection between the repair line and the repair electrode is formed due to the repair line being melted.

5. The electroluminescence display according to claim 2, wherein the light emitting diode further includes:
an emission layer on the anode electrode, the anode electrode including an opaque metal material; and
a cathode electrode on the emission layer, the cathode electrode including a transparent material,
wherein light generated from the emission layer passes through the cathode electrode.

6. The electroluminescence display according to claim 5, wherein the light passes through the cathode electrode at a portion of the light emitting diode where the repair electrode overlaps the drain electrode of the thin film transistor.

7. An electroluminescence display comprising:
a first pixel on a substrate, the first pixel including a first thin film transistor and a first light emitting element that is connected to the first thin film transistor, the first light emitting element including a first anode electrode having a first lower electrode layer and a first upper electrode layer that is on the first lower electrode layer;
a second pixel on the substrate, the second pixel including a second thin film transistor and a second light emitting element that is connected to the second thin film transistor, the second light emitting element including a second anode electrode having a second lower electrode layer and a second upper electrode layer that is on the second lower electrode layer;
a planarization layer on the first thin film transistor and the second thin film transistor, the planarization layer including a first depression and a second depression;
a first organic material in the first depression;
a second organic material in the second depression; and
a repair element having a first welding part and a second welding part, the first welding part overlapping the first light emitting element and the first depression, and the second welding part overlapping the second light emitting element and the second depression,
wherein a portion of the first lower electrode layer is disposed in the first depression and the first upper electrode layer is on the first lower electrode and the first organic material, and a portion of the second lower electrode layer is disposed in the second depression and the second upper electrode layer is on the second lower electrode and the second organic material.

8. The electroluminescence display according to claim 7, wherein the repair element includes:
a repair line extending from the first pixel to the second pixel;
a first repair electrode overlapping a first end of the repair line and the first depression with a first portion of a buffer layer and a first portion of a gate insulating layer between the first repair electrode and the first end of the repair line; and
a second repair electrode overlapping a second end of the repair line and the second depression with a second portion of the buffer layer and a second portion of the gate insulating layer between the second repair electrode and the second end of the repair line.

9. The electroluminescence display according to claim 8, wherein the first pixel is an operating pixel that is configured to emit light and the second pixel is defective such that the second pixel cannot emit light,
wherein a semiconductor layer of the second thin film transistor includes a cut to disable the second pixel, and
wherein the first end of the repair line is connected to the first repair electrode, and the second end of the repair line is connected to the second repair electrode to electrically connect the first pixel and the second pixel such that the second pixel is no longer defective.

10. The electroluminescence display according to claim 9, wherein the first thin film transistor includes:
a first switching thin film transistor; and
a first driving thin film transistor connected to the first switching thin film transistor, the first light emitting element connected to the first driving thin film transistor, wherein the second thin film transistor includes:
a second switching thin film transistor; and
a second driving thin film transistor connected to the second switching thin film transistor, the second light emitting element connected to the second driving thin film transistor.

11. The electroluminescence display according to claim 10, wherein the first repair electrode is connected to the first driving thin film transistor, and is on a same layer as a gate electrode of the first switching thin film transistor, and
wherein the second repair electrode is connected to the second driving thin film transistor, and is on a same layer as a gate electrode of the second switching thin film transistor.

12. The electroluminescence display according to claim 11, wherein the first end of the repair line penetrates through the first portion of the buffer layer and the first portion of the gate insulating layer to connect the first end of the repair line with the first repair electrode, and
wherein the second end of the repair line penetrates through the second portion of the buffer layer and the second portion of the gate insulating layer to connect the second end of the repair line with the second repair electrode.

13. The electroluminescence display according to claim 8, wherein the first light emitting element includes:
an emission layer on the first anode electrode, the first anode electrode including a metal material; and
a cathode electrode on the emission layer, the cathode electrode including a transparent conductive material,
wherein the second light emitting element includes:
the emission layer on the second anode electrode, the second anode electrode including the metal material; and
the cathode electrode on the emission layer, and
wherein light generated from the emission layer is emitted in a direction toward the cathode electrode.

14. The electroluminescence display according to claim 13, wherein the light generated from the first light emitting element is emitted to a first portion of the cathode electrode where the first repair electrode overlaps with the first end of the repair line and the first depression, and
wherein the light generated from the second light emitting element is emitted to a second portion of the cathode electrode where the second repair electrode overlaps with the second end of the repair line and the second depression.

15. An electroluminescence display comprising:
a first pixel on a substrate, the first pixel comprising a first thin film transistor and a first light emitting diode that is connected to the first thin film transistor, the first light emitting diode including a first anode electrode;
a repair line on the substrate that extends to the first pixel;
a first repair electrode overlapping the repair line, the first repair electrode connected to the first thin film transistor;
a planarization layer on the thin film transistor, the repair line, and the first repair electrode, the planarization layer including a first depression that overlaps the repair line and the first repair electrode;
a first organic material in the first depression,
wherein a first portion of the first anode electrode is disposed in the first depression such that the first portion of first anode electrode overlaps the repair line and the first repair electrode, and a second portion of the first anode electrode is disposed on the first organic material and the first portion of the first anode electrode without being disposed in the first depression.

16. The electroluminescence display according to claim 15, wherein the first pixel is defective and a semiconductor layer of the first thin film transistor includes a cut such that the first pixel is disabled, and the repair line is physically in contact with the first repair electrode such that a first portion of the repair line penetrates through a first portion of a buffer layer and a first portion of a gate insulating layer that is between the first repair electrode and the repair line.

17. The electroluminescence display according to claim 16, further comprising:
a second pixel on the substrate, the second pixel comprising a second thin film transistor and a second light emitting diode that is connected to the second thin film transistor, the second light emitting diode including a second anode electrode; and
a second repair electrode overlapping the repair line, the second repair electrode connected to the second thin film transistor and in physical contact with the repair line that is electrically connected to the first pixel such that a second portion of the repair line penetrates through a second portion of the buffer layer and a second portion of the gate insulating layer that is between the second repair electrode and the repair line;
a second organic material,
wherein the planarization layer includes a second depression that is at least partially filled with the second organic material, the second depression overlapping the repair line and the second repair electrode.

18. The electroluminescence display according to claim 17, wherein a first portion of the second anode electrode is disposed in the second depression such that the first portion of second anode electrode overlaps the repair line and the second repair electrode, and a second portion of the second anode electrode is disposed on the second organic material and the first portion of the second anode electrode without being disposed in the second depression.

19. The electroluminescence display according to claim 17, further comprising:
a passivation layer between the first repair electrode and the first portion of the first anode electrode, the first portion of the first anode electrode in contact with the passivation layer.

20. The electroluminescence display according to claim 17, further comprising:
a passivation layer between the first repair electrode and the first portion of the first anode electrode without the first portion of the first anode electrode being in contact with the passivation layer.

* * * * *